US012497696B2

United States Patent
Kurata et al.

(10) Patent No.: US 12,497,696 B2
(45) Date of Patent: Dec. 16, 2025

(54) GAS SUPPLY STRUCTURE AND SUBSTRATE PROCESSING APPARATUS

(71) Applicant: KOKUSAI ELECTRIC CORPORATION, Tokyo (JP)

(72) Inventors: Tomoyuki Kurata, Toyama (JP); Shinya Morita, Toyama (JP); Atsushi Hirano, Toyama (JP); Satoru Murata, Toyama (JP); Hiromi Okada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 311 days.

(21) Appl. No.: 17/379,273

(22) Filed: Jul. 19, 2021

(65) Prior Publication Data

US 2021/0348275 A1   Nov. 11, 2021

Related U.S. Application Data

(63) Continuation of application No. PCT/JP2020/006999, filed on Feb. 21, 2020.

(30) Foreign Application Priority Data

Mar. 20, 2019 (JP) .................................. 2019-052559

(51) Int. Cl.
*C23C 16/455* (2006.01)
(52) U.S. Cl.
CPC .............................. *C23C 16/45563* (2013.01)
(58) Field of Classification Search
CPC ................................................ C23C 16/45563
See application file for complete search history.

(56) References Cited

U.S. PATENT DOCUMENTS

| 3,645,564 A * | 2/1972 | Corriston ................ F16L 59/16 |
| | | 285/47 |
| 6,347,749 B1 * | 2/2002 | Moore .............. C23C 16/45563 |
| | | 427/248.1 |

(Continued)

FOREIGN PATENT DOCUMENTS

| JP | 07-115068 A | 5/1995 |
| JP | 11-111621 A | 4/1999 |

(Continued)

OTHER PUBLICATIONS

English translation JP H07115068, May 1885, Yamaga (Year: 1995).*

(Continued)

*Primary Examiner* — Keath T Chen
(74) *Attorney, Agent, or Firm* — Volpe Koenig

(57) ABSTRACT

A gas supply structure capable of suppressing damage to a structure provided in a reaction tube and made of the non-metallic material such as quartz includes: a gas supply nozzle through which a process gas is supplied into a process chamber in a reaction tube via an opening; a first seal provided so as to cover at least a gap between the opening of the reaction tube and the gas supply nozzle; a holder connected to the gas supply nozzle so as to provide a gap between the gas supply nozzle and the holder; an adapter connected to the holder; a first fixing structure configured to hold the holder and the adapter; and a second seal provided so as to cover at least a gap between the gas supply nozzle and the adapter and maintain a space between the gas supply nozzle and the adapter in an airtight state.

14 Claims, 6 Drawing Sheets

(56) References Cited

U.S. PATENT DOCUMENTS

| | | | |
|---|---|---|---|
| 6,634,845 B1 * | 10/2003 | Komino | H01L 21/67745 414/217 |
| 2009/0205783 A1 * | 8/2009 | Tanabe | C30B 29/08 118/724 |
| 2010/0186667 A1 * | 7/2010 | Ishii | C23C 16/46 118/712 |
| 2011/0139319 A1 * | 6/2011 | Kobayashi | H01L 21/67109 148/559 |
| 2014/0366808 A1 * | 12/2014 | Honma | C23C 16/4409 118/733 |

FOREIGN PATENT DOCUMENTS

| | | | | |
|---|---|---|---|---|
| JP | H11145072 | * | 5/1999 | H01L 21/22 |
| JP | 2009-094426 A | | 4/2009 | |

OTHER PUBLICATIONS

English translation JP JP H11145072, May 1999, Shimazu (Year: 1999).*
Chinese Office Action issued Jul. 13, 2022 for Chinese Patent Application No. 202090000433.6.
Chinese Office Action issued Jan. 25, 2022 for Chinese Patent Application No. 202090000433.6.
Japanese Office Action dated Apr. 14, 2022 for Japanese Patent Application No. 2021-507125.
Japanese Office Action dated Aug. 17, 2022 for Japanese Patent Application No. 2021-507125.

* cited by examiner

GAS SUPPLY STRUCTURE AND SUBSTRATE PROCESSING APPARATUS

CROSS-REFERENCE TO RELATED PATENT APPLICATION

This non-provisional U.S. patent application claims priority under 35 U.S.C. § 119 of International Application No. PCT/JP2020/006999, filed on Feb. 21, 2020, in the WIPO, and Japanese Patent Application No. 2019-052559, filed on Mar. 20, 2019, in the Japanese Patent Office, the entire contents of which are hereby incorporated by reference.

1. FIELD

The present disclosure relates to a gas supply structure and a substrate processing apparatus.

2. DESCRIPTION OF THE RELATED ART

Structures such as a reaction tube constituting a process chamber in which a substrate is processed and a boat supporting the substrate may be made of a non-metallic material such as quartz in order to suppress the metal contamination of the substrate. Further, in order to suppress the metal contamination of the substrate, a gas supply nozzle configured to supply a gas into the reaction tube may be made of a non-metallic material such as the quartz.

However, in such a configuration described above, a structure made of quartz may come into contact with a structure made of a metallic material. As a result, the structure made of quartz may be damaged.

SUMMARY

Described herein is a technique capable of suppressing a damage to a structure provided in a reaction tube even when the structure is made of a non-metallic material such as quartz.

According to one aspect of the technique of the present disclosure, there is provided a gas supply structure including: a gas supply nozzle through which a process gas is supplied into a process chamber provided in a reaction tube via an opening of the reaction tube; a first seal provided so as to cover at least a gap between the opening of the reaction tube and the gas supply nozzle; a holder connected to the gas supply nozzle so as to provide a gap between the gas supply nozzle and the holder; an adapter connected to the holder; a first fixing structure configured to hold the holder and the adapter; and a second seal provided so as to cover at least a gap between the gas supply nozzle and the adapter and maintain a space between the gas supply nozzle and the adapter in an airtight state.

DETAILED DESCRIPTION

Embodiments

Hereinafter, one or more embodiments (also simply referred to as "embodiments") according to the technique of the present disclosure will be described with reference to the drawings.

(1) Configuration of Substrate Processing Apparatus

First, a configuration of a substrate processing apparatus according to the embodiments of the present disclosure will be described with reference to FIGS. 1 and 2.

Figure 1:
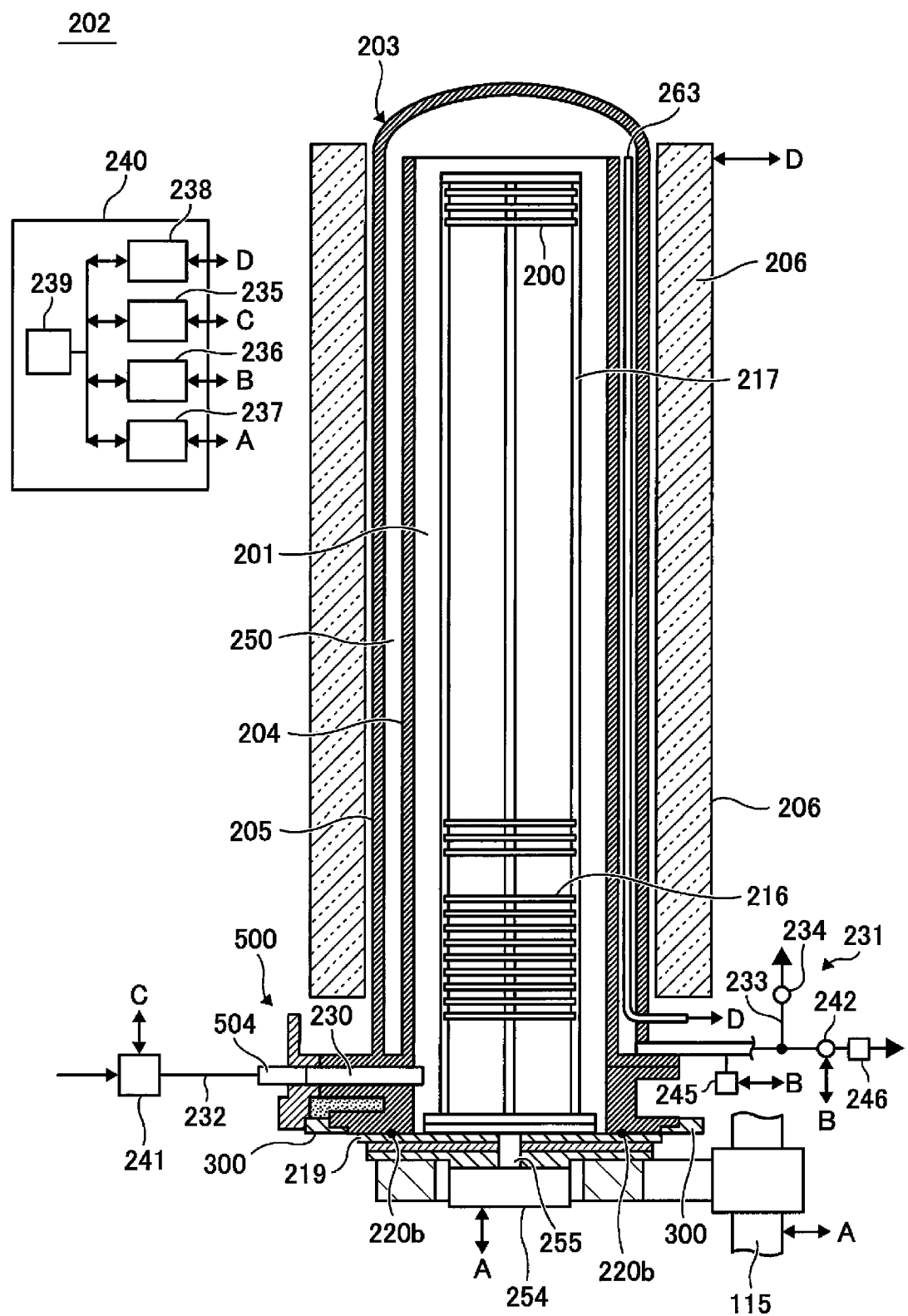
FIG. 1 is a diagram schematically illustrating a vertical cross-section of a process furnace of a substrate processing apparatus according to one or more embodiments described herein.

As shown in FIG. 1, the substrate processing apparatus includes a process furnace 202. The process furnace 202 includes a heater 206 serving as a heating structure (or a heating apparatus). The heater 206 is of a cylinder shape, and is vertically installed.

A process tube 203 serving as a reaction tube is provided at an inner side of the heater 206 to be aligned in a manner concentric with the heater 206. The process tube 203 includes an inner tube 204 serving as an inner reaction tube and an outer tube 205 serving as an outer reaction tube provided outside the inner reaction tube. The inner tube 204 is made of a heat resistant material such as quartz ($SiO_2$) and silicon carbide (SiC). For example, the inner tube 204 is of a cylindrical shape with open upper and lower ends. A process chamber 201 in which a plurality of substrates including a substrate 200 are processed is provided in a hollow cylindrical portion of the inner tube 204. That is, the process chamber 201 is constituted by an inner portion of the inner tube 204. Hereinafter, the plurality of substrates including a substrate 200 may also simply be referred to as substrates 200. The process chamber 201 is configured such that a boat 217 serving as a substrate retainer described later can be accommodated in the process chamber 201. The boat 217 is configured to accommodate the substrates 200 such as silicon substrates and glass substrates in a multistage manner while the substrates 200 are horizontally oriented with their centers aligned with one another. The outer tube 205 is made of a heat resistant material such as quartz ($SiO_2$) and silicon carbide (SiC). For example, the outer tube 205 is of a cylindrical shape with a closed upper end and an open lower end. An inner diameter of the outer tube 205 is greater than an outer diameter of the inner tube 204. The outer tube 205 is provided concentrically with the inner tube 204.

The process tube 203 is provided with at least one opening (through-hole) 203a into which a gas supply nozzle is inserted. Hereinafter, the at least one opening 203a may also be referred to as the opening 203a or the openings 203a. Specifically, the opening 203a is provided on a side wall of the process tube 203. A gas supply nozzle 230 of a pipe shape is connected to the opening 203a in an airtight manner so as to communicate with an inside and an outside of the process tube 203.

The gas supply nozzle 230 is configured to supply a process gas to the process chamber 201 provided in the process tube 203 through the opening 203a. As shown in FIG. 1, a straight nozzle whose downstream end extends laterally with respect to the process tube 203 is used as the gas supply nozzle 230. However, an L-shaped nozzle whose downstream end extends downward vertically or an L-shaped nozzle whose downstream end extends upward vertically may be used as the gas supply nozzle 230. The gas supply nozzle 230 is made of a heat resistant non-metallic material such as quartz ($SiO_2$). An upstream end of the gas supply nozzle 230 protrudes out of the process tube 203, and is connected to a gas supply structure 500 and a gas supply pipe 232, which will be described later. A process gas supply source (not shown) or an inert gas supply source (not shown) is connected to an upstream side of the gas supply pipe 232 (that is, a portion of the gas supply pipe 232 opposite to a portion to which the gas supply nozzle 230 is connected) via a mass flow controller (MFC) 241 serving as a flow rate controller. A gas flow rate controller 235 is electrically connected to the MFC 241. The MFC 241 is configured to control a flow rate of a gas such as the process gas supplied to the process chamber 201 such that the flow rate of the gas supplied into the process chamber 201 is at a desired flow rate at a desired timing.

An exhaust system 231 configured to exhaust an inner atmosphere of the process chamber 201 is provided on the side wall of the process tube 203. The exhaust system 231 is arranged at a lower end of a tubular space 250 defined by a gap between the inner tube 204 and the outer tube 205, and communicates with the tubular space 250. A vacuum exhaust apparatus 246 such as a vacuum pump is connected to a downstream side of the exhaust system 231 (that is, a portion of the exhaust system 231 opposite to a portion to which the process tube 203 is connected) via a pressure sensor 245 serving as a pressure detector and a main valve 242. The main valve 242 is configured to shut off a portion between the process chamber 201 and the vacuum exhaust apparatus 246, and to appropriately change an opening degree thereof such that an inner pressure of the process chamber 201 reaches and is maintained at a predetermined pressure (vacuum degree). A pressure controller 236 is electrically connected to the main valve 242 and the pressure sensor 245. The pressure controller 236 is configured to feedback control the opening degree of the main valve 242 based on an inner pressure of the exhaust system 231 or the inner pressure of the process chamber 201 detected by the pressure sensor 245 such that the inner pressure of the process chamber 201 is at a desired pressure at a desired timing. An overpressure prevention line 233 configured to perform an overpressure prevention process is connected to an upstream side of the main valve 242 of the exhaust system 231. An overpressure prevention valve 234 is inserted into the overpressure prevention line 233. When the inner pressure of the process chamber 201 is overpressurized and an overpressurized state of the process chamber 201 is detected by the pressure sensor 245, the pressure controller 236 opens the overpressure prevention valve 234 to change the overpressurized state of the process chamber 201 to a normal state.

As shown in FIG. 1, a furnace opening flange 300 serving as a furnace opening is provided on an outer periphery of a lower end of the process tube 203 (that is, the lower ends of the inner tube 204 and the outer tube 205). The process tube 203 is vertically installed on the furnace opening flange 300. The furnace opening flange 300 is made of a metallic material such as stainless steel.

A seal cap 219 serving as a furnace opening lid capable of airtightly sealing a lower end opening of the process tube 203 is provided under the process tube 203. The seal cap 219 is in contact with the lower end of the process tube 203 from thereunder. For example, the seal cap 219 is made of a metallic material such as the stainless steel, and is of a disk shape. An O-ring 220b serving as a seal is provided on an upper surface of the seal cap 219 so as to be in contact with the lower end of the process tube 203. A rotator 254 configured to rotate the boat 217 is provided at the seal cap 219 opposite to the process chamber 201. A rotating shaft 255 of the rotator 254 penetrates the seal cap 219 while maintaining the airtightness of the process chamber 201, and is connected to the boat 217 described later. As the rotator 254 rotates the boat 217, the substrates 200 supported by the boat 217 are rotated. That is, the rotator 267 is configured to rotate the substrates 200. The seal cap 219 may be elevated or lowered in the vertical direction by a boat elevator 115 serving as an elevator vertically installed outside the process tube 203. When the seal cap 219 is elevated or lowered by the boat elevator 115, the boat 217 may be transferred (loaded) into the process chamber 201 or transferred (unloaded) out of the process chamber 201. A drive controller 237 is electrically connected to the rotator 254 and the boat elevator 115. The drive controller 237 is configured to control the rotator 254 and the boat elevator 115 so as to perform a desired operation at a desired timing.

For example, the boat 217 is made of a heat resistant material such as quartz ($SiO_2$) and silicon carbide (SiC). The boat 217 is configured to support (or hold) the substrates 200 in a multistage manner while the substrates 200 are horizontally oriented with their centers aligned with one another. An insulating plate 216 serving as a heat insulator is provided under the boat 217. For example, the insulating plate 216 is made of a heat resistant material such as quartz ($SiO_2$) and silicon carbide (SiC), and is of a disk shape. A plurality of insulating plates including the insulating plate 216 may be arranged in a horizontal orientation in a multistage manner. The insulating plate 216 is configured to suppress the transmission of the heat from the heater 206 to the furnace opening flange 300.

A temperature sensor 263 serving as a temperature detector is provided in the process tube 203. A temperature controller 238 is electrically connected to the heater 206 and the temperature sensor 263. The temperature controller 238 is configured to control a state of the electric conduction to the heater 206 based on temperature information detected by the temperature sensor 263 such that a desired temperature distribution of an inner temperature of the process chamber 201 can be obtained at a desired timing.

The gas flow rate controller 235, the pressure controller 236, the drive controller 237 and the temperature controller 238 also constitute an operation structure (not shown) or an input/output device (not shown), and are electrically connected to a main controller 239 configured to control the entire substrate processing apparatus. A controller 240 is constituted by the gas flow rate controller 235, the pressure controller 236, the drive controller 237, the temperature controller 238 and the main controller 239.

(2) Configuration of Gas Supply Structure According to Present Embodiments

Subsequently, a configuration of the gas supply structure 500, which is an introduction structure of the gas supply nozzle 230 according to the present embodiments, will be described with reference to FIGS. 2 through 5. The gas supply nozzle 230 according to the present configuration is made of a heat resistant non-metallic material such as quartz (SiO$_2$) and silicon carbide (SiC).

Figure 4:
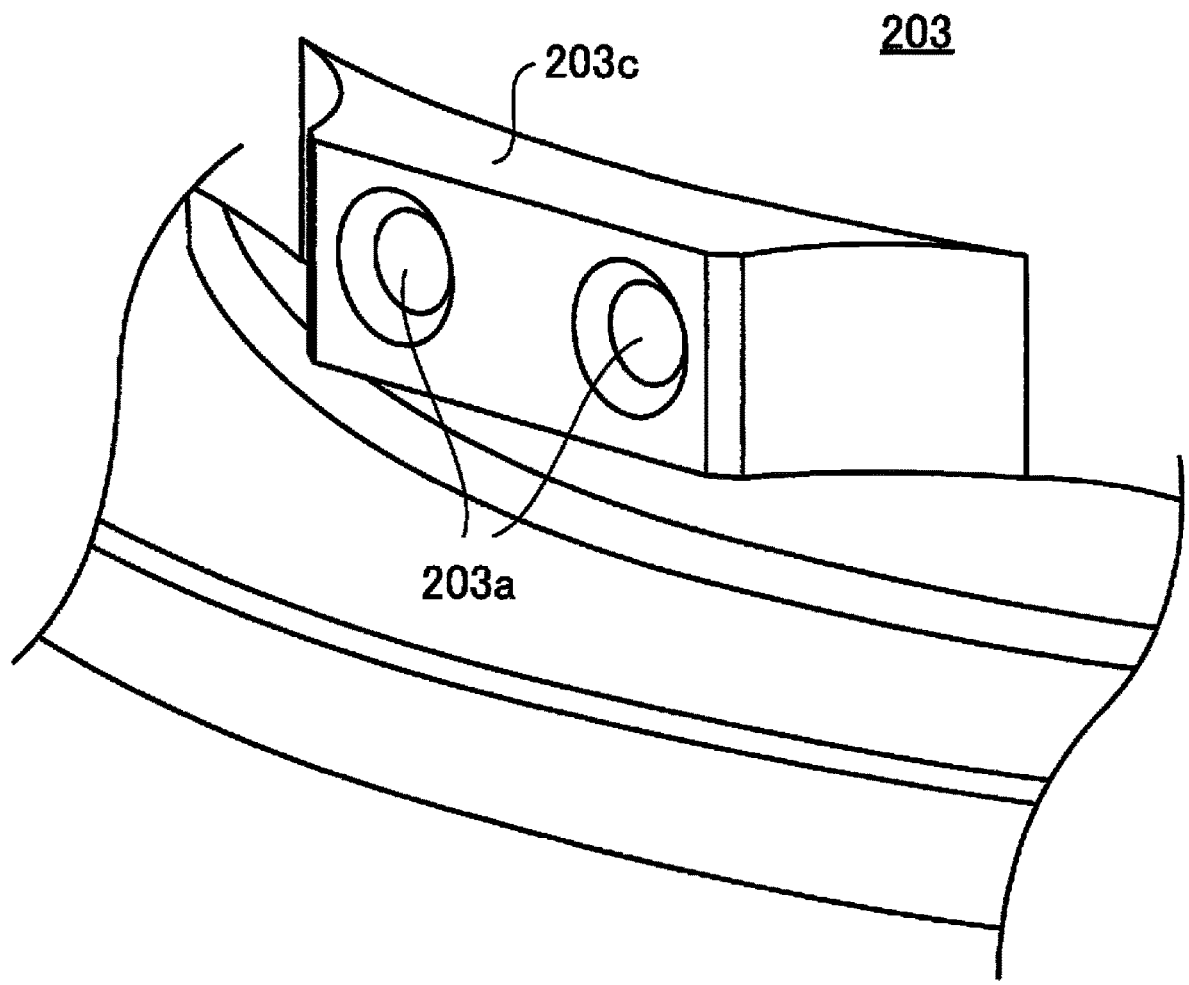
FIG. 4 is a diagram schematically illustrating a perspective view around the opening of the reaction tube of the substrate processing apparatus according to the embodiments described herein.

As shown in FIG. 4, the at least one opening 203a into which the gas supply nozzle 230 is inserted is provided at a lower side wall of the process tube 203 (for example, two openings 203a are provided as shown in FIG. 4). The opening 203a is provided at a protruding portion 203c of a block shape protruding from a side wall surface of the process tube 203. Further, the opening 203a is tapered so that a front end of the opening 203a becomes narrower as it goes further inside from outside.

Figure 3:
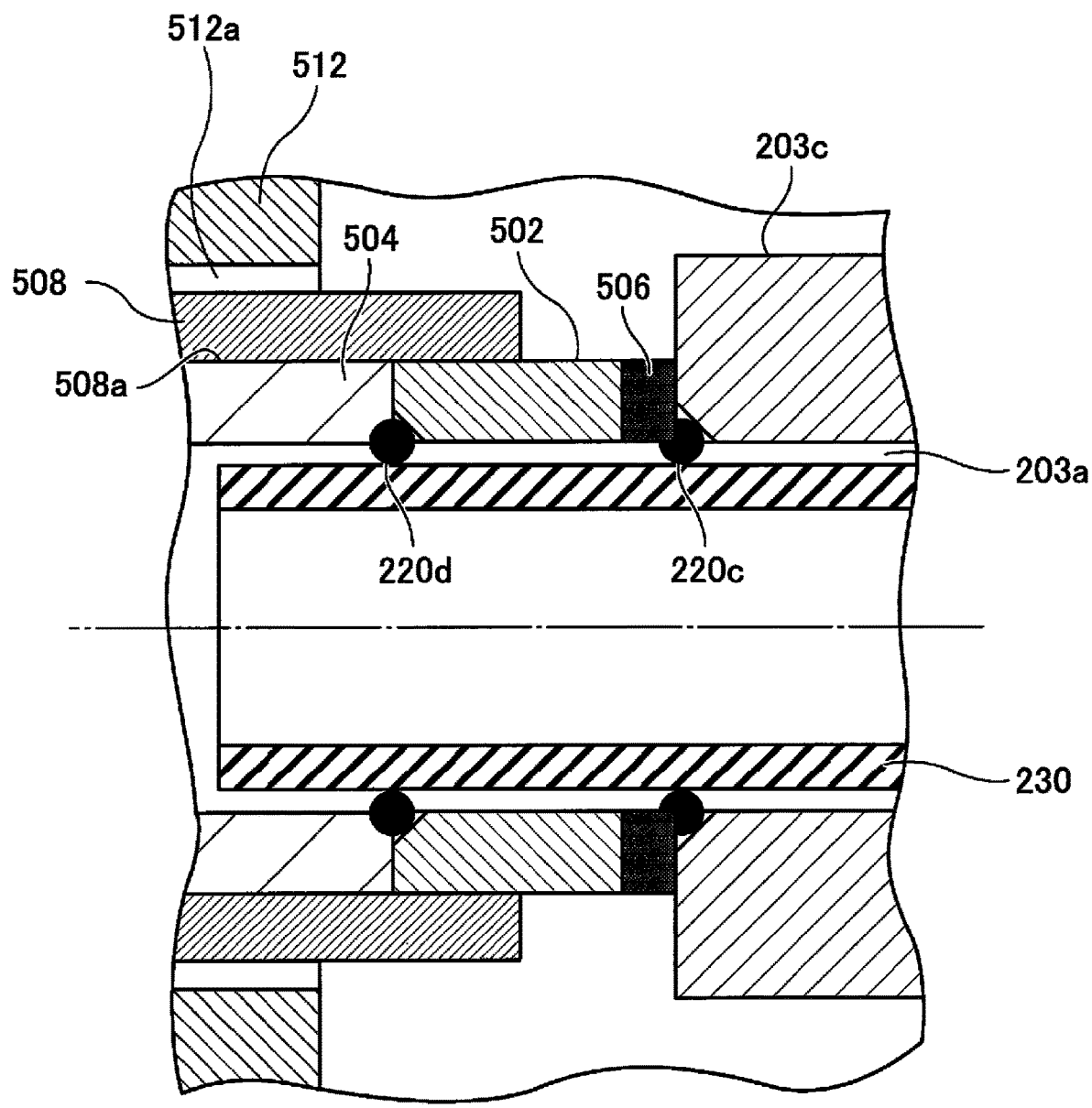
FIG. 3 is a diagram schematically illustrating a vertical cross-section around an opening of a reaction tube of the substrate processing apparatus according to the embodiments described herein.

As shown in FIG. 3, the upstream end of the gas supply nozzle 230 is arranged so as to protrude out of the process tube 203 via the opening 203a.

Figure 5:
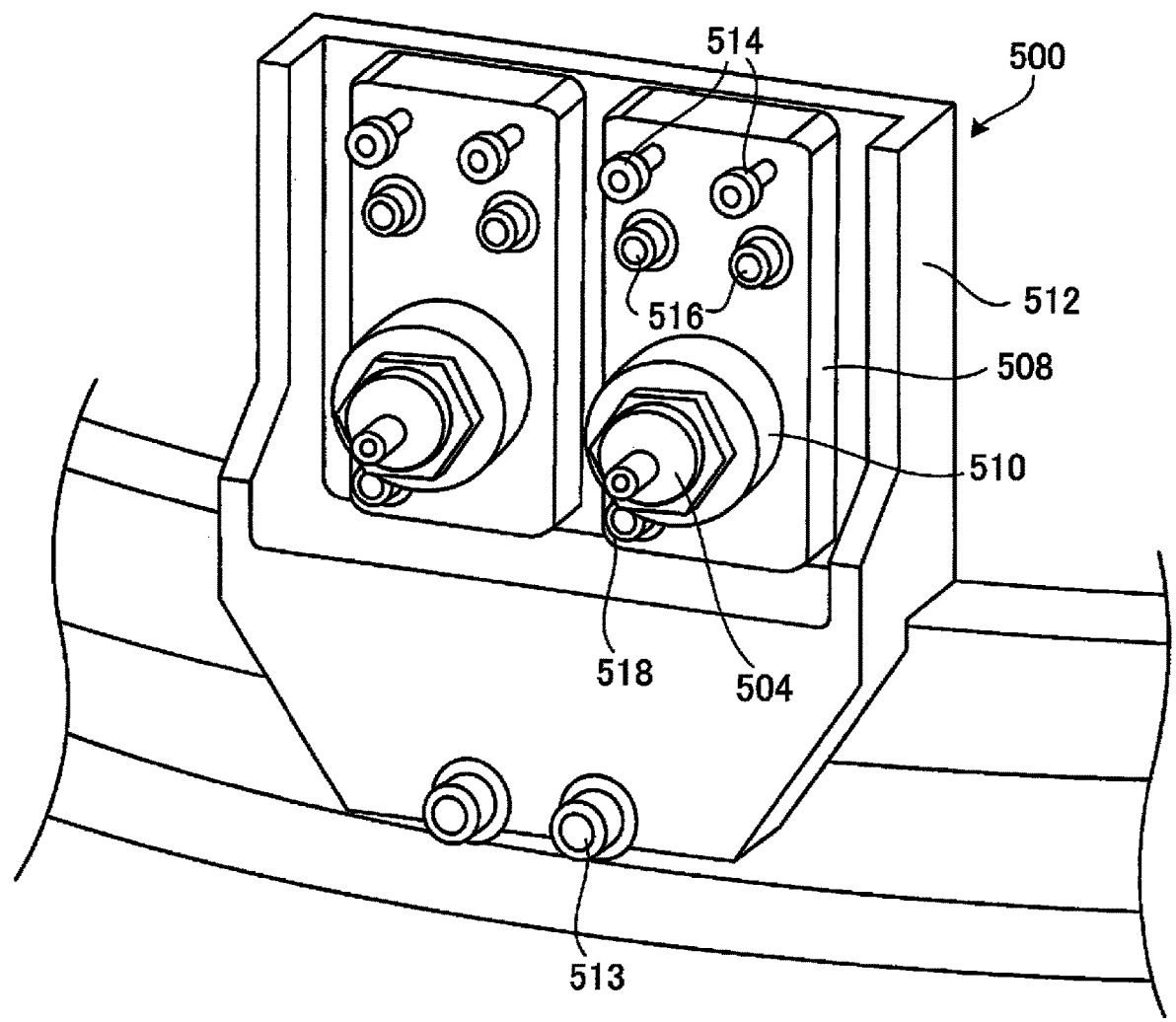
FIG. 5 is a diagram schematically illustrating a perspective view around the gas supply structure of the process furnace of the substrate processing apparatus according to the embodiments described herein.

As shown in FIGS. 3 and 5, a block 512 at which an opening 512a is provided is mounted on the protruding portion 203c of the opening 203a of the process tube 203. The block 512 serves as a third fixing structure, and is fixed to the furnace opening flange 300 by a fixing bolt 513.

Figure 2:
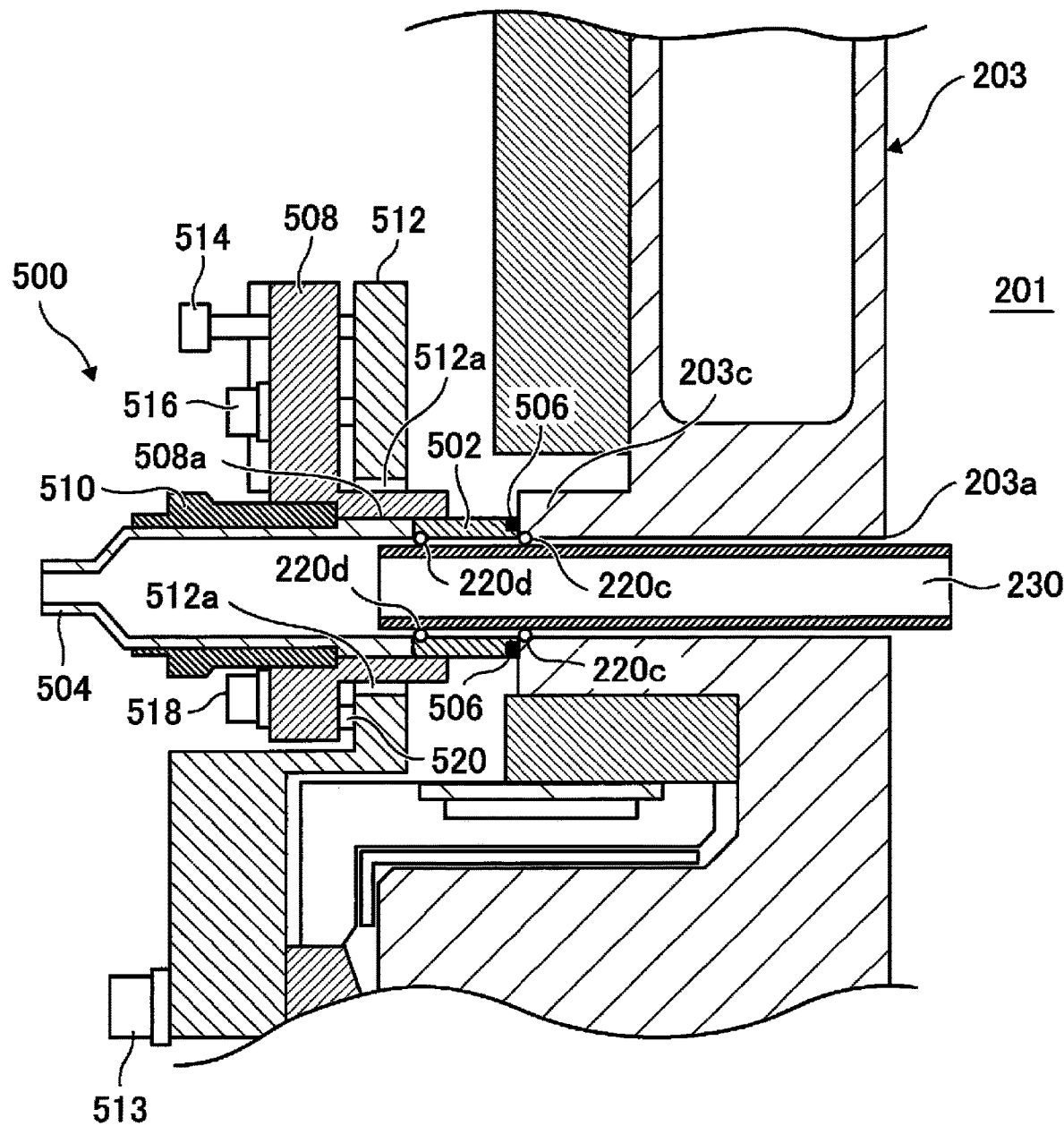
FIG. 2 is a diagram schematically illustrating a vertical cross-section around a gas supply structure of the process furnace of the substrate processing apparatus according to the embodiments described herein.

As shown in FIG. 2, a retainer 502 serving as a holder is of a ring shape. A part of the gas supply nozzle 230 is arranged inside the retainer 502, and a gap is provided between the retainer 502 and the gas supply nozzle 230. An O-ring 220c serving as a first seal and an O-ring 220d serving as a second seal are provided so as to cover the gap between the retainer 502 and the gas supply nozzle 230. That is, the retainer 502 is configured to hold the gas supply nozzle 230 at an outer peripheral portion of the gas supply nozzle 230 via the O-rings 220c and 220d. Further, the retainer 502 is connected to the gas supply nozzle 230 via the process tube 203 and the O-ring 220c. That is, the O-ring 220c is provided so as to cover a gap between the opening 203a and the gas supply nozzle 230.

As shown in FIG. 2, a cushion ring 506 serving as a cushioning structure of a ring shape is attached to a front end surface of the retainer 502 at which the retainer 502 is connected to the process tube 203. That is, the cushion ring 506 is provided between the retainer 502 and the process tube 203. In other words, the retainer 502 is configured to come into contact with an outer peripheral side of the process tube 203 via the O-ring 220c and the cushion ring 506. For example, the retainer 502 according to the present configuration is made of a metallic material. Further, the cushion ring 506 is made of a non-metallic material. For example, the cushion ring 506 is made of a fluororesin such as polytetrafluoroethylene (PTFE).

As shown in FIG. 3, the cushion ring 506 is provided so as to surround an outer periphery of the O-ring 220c. The cushion ring 506 is configured to prevent the retainer 502 made of the metallic material from coming into direct contact with the process tube 203 made of quartz when the retainer 502 is pressed against the process tube 203 and the O-ring 220c is compressed. That is, by providing the cushion ring 506 at a portion of the retainer 502 adjacent to the process tube 203, it is possible to prevent the contact between the retainer 502 made of the metallic material and a structure made of quartz (i.e., the process tube 203).

Further, an O-ring adapter 504 is attached to the retainer 502 at a location upstream thereof via the O-ring 220d. A part of the gas supply nozzle 230 is inserted inside the O-ring adapter 504, and a gap is provided between the O-ring adapter 504 and the gas supply nozzle 230. The O-ring 220d is provided so as to cover the gap between the O-ring adapter 504 and the gas supply nozzle 230. That is, the O-ring adapter 504 is configured to hold the gas supply nozzle 230 at the outer peripheral portion of the gas supply nozzle 230 via the O-ring 220d. In other words, the O-ring adapter 504 is connected to the gas supply nozzle 230 from outside of the process tube 203 via the O-ring 220c, the retainer 502 and the O-ring 220d. For example, the O-ring adapter 504 is made of a material such as Hastelloy (registered trademark).

As shown in FIG. 2, the O-ring adapter 504 is connected to and in communication with the gas supply nozzle 230. The O-ring adapter 504 is tapered so that an upstream end of the O-ring adapter 504 narrows, and is connected to the gas supply pipe 232. That is, the upstream end of the gas supply nozzle 230 is connected to the gas supply pipe 232 via the O-ring adapter 504 in an airtight manner.

When attaching the O-ring 220c to the opening 203a, it is preferable that, for example, as shown in FIG. 3, an opening diameter of the opening 203a is widened at its front end region (that is, a region vertically overlapping with the retainer 502) is widened so that an inclined portion of a tapered shape is formed at a corner of the protruding portion 203c, and the O-ring 220c is fit into the inclined portion of the opening 203a. Further, in order to prevent the O-ring 220d from falling off, it is preferable that, for example, an opening diameter of the opening 203 is widened at a region vertically overlapping with a corner of the retainer 502 adjacent to the O-ring adapter 504 so that an inclined portion of a tapered shape is formed at the corner of the retainer 502. Also, the O-ring 220d is fit into the inclined portion of the retainer 502. For example, the O-rings 220c and 220d are made of a material such as a resin.

That is, the gas supply nozzle 230 and the retainer 502 are connected via the O-ring 220c to maintain the opening 203a in an airtight state. The gas supply nozzle 230, the retainer 502 and the O-ring adapter 504 are connected in an airtight manner via the O-ring 220d. That is, the O-ring 220d is provided so as to maintain a space between the gas supply nozzle 230, the retainer 502 and the O-ring adapter 504 in an airtight state such that the process chamber 201 is maintained in an airtight state.

An opening 508a is provided at a floating block 508 serving as a first fixing structure. The retainer 502 and the O-ring adapter 504 may be held in the opening 508a of the floating block 508. The floating block 508 is fixed so that the opening 203a, the retainer 502 and the O-ring adapter 504 are arranged concentrically.

As shown in FIG. 2, a nut 510 serving as a second fixing structure is connected to an outer peripheral portion of the O-ring adapter 504 in the opening 508a of the floating block 508. The nut 510 is configured to press the O-ring adapter 504 toward the process tube 203 so as to close the opening 203a in an airtight manner. For example, the nut 510 is made of a metallic material such as the stainless steel.

As shown in FIG. 5, a lower end of the floating block 508 is fixed to the block 512 by a fixing bolt 518 via a washer 520. Further, at an upper end of the floating block 508, for example, two push bolts 514 and two pull bolts 516 are provided. By individually adjusting the push bolts 514 and the pull bolts 516, a surface angle (direction) of the floating block 508 can be adjusted and fixed at an appropriate position. That is, the floating block 508 is configured to be fixed in an appropriate posture with respect to the block 512. That is, as shown in FIG. 3, the floating block 508 is adjusted substantially horizontally with respect to the O-rings 220c and 220d and moved toward the process tube 203. As a result, the retainer 502 is pressed against the outer periphery of the process tube 203 to airtightly close a portion around the opening 203a.

While the block 512 is fixed to the side wall surface of the process tube 203, the block 512 is configured to connect the O-ring 220c, the cushion ring 506, the retainer 502, the O-ring 220d, the floating block 508, the O-ring adapter 504 and the nut 510 in this order with respect to the gas supply nozzle 230 protruding from the opening 203a to the outside of the process tube 203. For example, the block 512 and the floating block 508 according to the present configuration are made of a metallic material such as the stainless steel.

A block heater (not shown) serving as a heating structure may be provided between the block 512 and the process tube 203. By providing the block heater between the block 512 and the process tube 203, it is possible to heat components such as the gas supply nozzle 230, the process tube 203 and the O-ring adapter 504 so as not to lower a temperature of the process gas.

(3) Substrate Processing

Subsequently, a substrate processing performed by the substrate processing apparatus according to the present embodiments will be described.

First, the substrates 200 are loaded into the boat 217 unloaded out of the process tube 203 (wafer charging step). As a result, the substrates 200 (for example, 100 substrates whose diameters are 300 mm) on which a film is to be formed are accommodated in the boat 217. When the entirety of the substrates 200 are loaded, the boat 217 holding the substrates 200 is elevated by the boat elevator 115 and loaded into the process chamber 201 (boat loading step) as shown in FIG. 1. That is, a step of loading the substrates 200 into the process chamber 201 is performed. With the boat 217 loaded in the process chamber 201, the lower end of the process tube 203 is airtightly sealed (or closed) by the seal cap 219 via the O-ring 220b.

After the step of loading the substrates 200 into the process chamber 201 is completed, the process chamber 201 is exhausted by the vacuum exhaust apparatus 246 such that the inner pressure of the process chamber 201 reaches and is maintained at a desired pressure (vacuum degree). The inner atmosphere of the process chamber 201 is exhausted through the exhaust system 231. When exhausting the inner atmosphere of the process chamber 201, the inner pressure of the process chamber 201 is detected by the pressure sensor 245. Based on pressure information detected by the pressure sensor 245, the opening degree of the main valve 242 is feedback-controlled. Further, the process chamber 201 is heated by the heater 206 such that the inner temperature of the process chamber 201 reaches and is maintained at a desired temperature. The state of the electric conduction to the heater 206 is feedback-controlled based on the temperature information detected by the temperature sensor 263 such that a desired temperature distribution of the inner temperature of the process chamber 201 can be obtained. Subsequently, the substrates 200 are rotated by rotating the boat 217 by the rotator 254.

Subsequently, the process gas is supplied to the process chamber 201 to perform a film-forming process on the substrates 200. That is, the gas (that is, the process gas) supplied from the process gas supply source (not shown) and whose flow rate is controlled to a desired flow rate by the MFC 241 is supplied though the gas supply pipe 232 serving as a gas supply body, and is introduced into the process chamber 201 through the gas supply nozzle 230. The gas introduced into the process chamber 201 then flows upward in the process chamber 201, flows into the tubular space 250 through an upper end opening of the inner tube 204, and is exhausted through the exhaust system 231. The process gas comes into contact with surfaces of the substrates 200 while flowing through the process chamber 201. When the process gas comes into contact with the surfaces of the substrates 200, a film is formed (or deposited) on the surfaces of the substrates 200 by a thermal CVD (chemical vapor deposition) reaction.

After the film-forming process is completed, an after-purge process is performed. That is, an inert gas is supplied to the process chamber 201 through the gas supply pipe 232 and the gas supply nozzle 230. When supplying the inert gas, the vacuum exhaust apparatus 246 executes a vacuum exhaust process. As a result, the inner atmosphere of the process chamber 201 is cleaned by the inert gas.

After the after-purge process is completed, a process of returning to an atmospheric pressure is performed. That is, the vacuum exhaust process is stopped and a process of supplying the inert gas alone is performed. As a result, the inner pressure of the process chamber 201 returns to the normal pressure.

At least, the film-forming process, the after-purge process and the process of returning to the atmospheric pressure are performed with the opening 203a airtightly closed. The opening 203a is airtightly closed by pressing the O-ring adapter 504 and the retainer 502 holding the gas supply nozzle 230 against the side wall of the process tube 203 by the nut 510 and the floating block 508. That is, at least while supplying the gas to the process chamber 201, the floating block 508 is adjusted substantially horizontally with respect to the O-rings 220c and 220d and moved toward the process tube 203, and the retainer 502 is pressed against the side wall of the process tube 203 via the O-ring 220c to airtightly close the portion around the opening 203a.

After the process of returning to the atmospheric pressure is completed, a boat unloading process is performed. That is, the seal cap 219 is lowered by the boat elevator 115 to open the lower end of the process tube 203. Then, the boat 217 with the processed substrates 200 is unloaded out of the process tube 203 through the lower end of the process tube 203 (boat unloading step). That is, a step of unloading the substrates 200 out of the process chamber 201 is performed. Thereafter, the processed substrates 200 (that is, the substrates 200 on which the film-forming process is performed) are unloaded out of the boat 217 (wafer discharging). Thereby, the processing for a first batch is completed. Thereafter, in a second and subsequent batches, similarly, the processing described above is performed on the substrates 200 to be processed.

(4) Configuration of Gas Supply Structure According to Comparative Example

Figure 6:
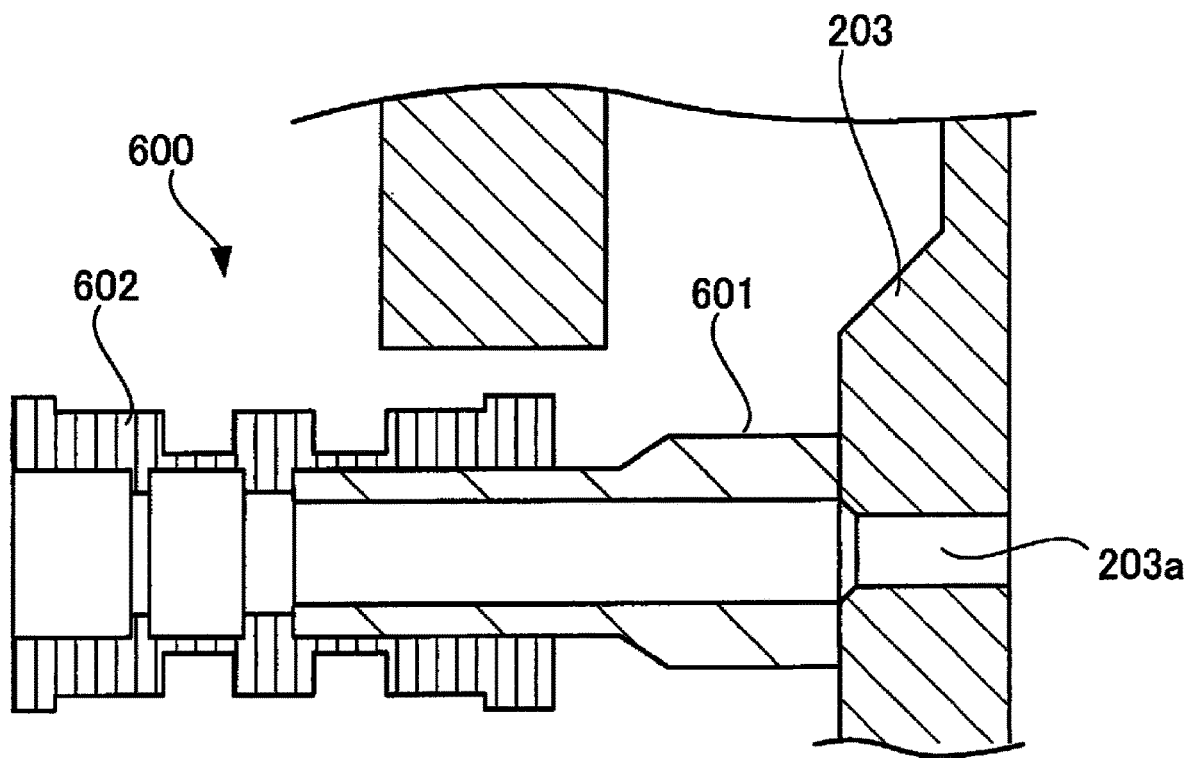
FIG. 6 is a diagram schematically illustrating a perspective view around a gas supply structure of a process furnace of a substrate processing apparatus according to a comparative example.

Subsequently, a configuration of a gas supply structure 600, which is an introduction structure of the gas supply nozzle 230 according to a comparative example, will be described with reference to FIG. 6.

As described above, the at least one opening (through-hole) 203a into which the gas supply nozzle 230 is inserted is provided on the side wall of the process tube 203. A gas port structure 601 made of quartz and surrounding the outer peripheral portion of the gas supply nozzle 230 inserted into the opening 203a is connected to the process tube 203 on the side wall surface of the process tube 203 so as to close the opening 203a and the outer peripheral portion of the gas supply nozzle 230 in an airtight manner. The gas port structure 601 protrudes from the side wall surface of the process tube 203. That is, the gas port structure 601 is connected to the process tube 203 so as to communicate with the opening 203a of the process tube 203. A joint 602 made of a metallic material is connected to an upstream end of the gas port structure 601. That is, the gas port structure 601 and the joint 602 are connected by tightening the joint 602 made of the metallic material to the gas port structure 601 made of quartz protruding from the side wall surface of the process tube 203.

Then, the gas supply nozzle 230 is inserted into the opening 203*a* of the process tube 203 and is held by the joint 602 described above. The gas supply nozzle 230 and the joint 602 are in close contact with each other such that the process chamber 201 is maintained in an airtight state.

According to the configuration of the comparative example described above, for example, the gas port structure 601 made of quartz protruding from the side wall surface of the process tube 203 made of quartz is fastened by the joint 602 made of metal. Therefore, there is a problem that the gas port structure 601 made of quartz is easily damaged. Further, since the gas port structure 601 protrudes to the outside of the process tube 203, there is a problem that the gas port structure 601 is easily damaged by coming into contact with other components. Further, when the gas supply nozzle 230 is a long nozzle, there is a problem that the gas supply nozzle 230 cannot be held by the gas port structure 601. Thereby, the gas supply nozzle 230 may be tilted or the gas port structure 601 may be easily damaged by the load applied thereto.

However, according to the gas supply structure 500 of the present embodiments, it is possible to suppress the damage to the structure made of quartz since the structure made of a metallic material and the structure (for example, the gas supply nozzle 230 and the process tube 203) made of a non-metallic material such as quartz are not in direct contact with each other. Further, as compared with the gas supply structure 600 described above, the gas supply structure 500 protrudes into a block shape. Thus, it is possible to further prevent the damage and the contact between the structure made of the metallic material and the structure made of the non-metallic material. In addition, as compared with the gas supply structure 600 described above, by adjusting the floating block 508 horizontally with respect to the O-rings 220*c* and 220*d* and adjusting a pressing force against the O-ring adapter 504 by the nut 510, it is possible to improve the airtightness of the process chamber 201, to stably fix the gas supply nozzle 230 at an appropriate position, and to stably supply the process gas. Even when a long nozzle is used as the gas supply nozzle 230, it is possible to stably fix the gas supply nozzle 230, and to stably supply the process gas.

(5) Effects According to Present Embodiments

According to the present embodiments, it is possible to provide one or more of the following effects.

According to the present embodiments, the film-forming process, the after-purge process and the process of returning to the atmospheric pressure are performed with the opening 203*a* airtightly closed. The opening 203*a* is airtightly closed by pressing the O-ring adapter 504 and the retainer 502 holding the gas supply nozzle 230 against the side wall (outer peripheral portion) of the process tube 203 by the nut 510. Therefore, it is possible to perform the processes described above while maintaining the airtightness of the process chamber 201.

According to the present embodiments, since exposed components in the process furnace 202 such as the process tube 203 and the gas supply nozzle 230 are made of the non-metallic material such as quartz, it is possible to reduce exposed surfaces of the structures made of the metallic material in the process chamber 201. Therefore, it is possible to reduce a possibility that the substrate 200 is contaminated with the metal when a process such as the film-forming process is performed on the substrate 200.

According to the present embodiments, the opening 203*a* into which the gas supply nozzle 230 is introduced is provided on the protruding portion 203*c* protruding from the side wall surface of the process tube 203 into a block shape. Thus, the damage is prevented.

According to the present embodiments, it is possible to simplify the shape of the process tube 203 made of quartz, and to reduce the manufacturing cost of the substrate processing apparatus.

According to the present embodiments, it is possible to adjust and fix the surface angle (direction) of the floating block 508 at an appropriate position by individually adjusting the push bolts 514 and the pull bolts 516 of the floating block 508. That is, it is possible to fix the floating block 508 in an appropriate posture with respect to the block 512. In other words, it is possible that the floating block 508 is adjusted substantially horizontally with respect to the O-rings 220*c* and 220*d* and moved toward the process tube 203. As a result, the portion around the opening 203*a* can be airtightly closed by pressing the retainer 502 and the O-ring adaptor 504 to the side wall of the process tube 203 by the nut 510.

According to the present embodiments, the upstream end of the gas supply nozzle 230 is connected to the gas supply pipe 232 via the O-ring adapter 504 in an airtight manner. Specifically, the O-ring adapter 504 is arranged at the downstream end of the gas supply pipe 232, and by fixing the nut 510 to the outer peripheral portion of the O-ring adapter 504, the opening 508*a* is closed by the nut 510. Further, in order to press the O-ring 220*d* between the O-ring adapter 504 and the retainer 502, the gas supply pipe 232 and the gas supply nozzle 230 are configured to be connected in an airtight manner.

According to the present embodiments, the cushion ring 506 is attached to the front end surface of the retainer 502 outside the O-ring 220*c* so as to surround the outer peripheral portion of the O-ring 220*c*. Therefore, when the retainer 502 is pressed against the process tube 203 and the O-ring 220*c* is compressed, it is possible to prevent the retainer 502 made of the metallic material from directly contacting the process tube 203 made of quartz, and it is also possible to suppress the damage of the process tube 203 due to the contact with the structures made of the metallic material.

Other Embodiments

While the technique is described in detail by way of the embodiments, the above-described technique is not limited thereto. The above-described technique may be modified in various ways without departing from the gist thereof.

For example, a type of the film formed on the substrate using the substrate processing apparatus according to the embodiments described above is not particularly limited. For example, the above-described technique may be applied to processes of forming films of various types such as a nitride film such as a silicon nitride (SiN) film, an oxide film such as a silicon oxide (SiO) film and a metal oxide film.

For example, the above-described technique may be applied not only to a semiconductor manufacturing apparatus capable of processing a semiconductor substrate such as the substrate processing apparatus according to the embodiments but also to other substrate processing apparatuses such as an LCD (liquid crystal display) manufacturing apparatus capable of processing a glass substrate.

As described above, according to some embodiments in the present disclosure, it is possible to suppress the damage to the structure provided in the reaction tube even when the structure is made of the non-metallic material such as quartz.

What is claimed is:

1. A gas supply structure comprising:
a gas supply nozzle made of quartz through which a process gas is supplied into a process chamber provided in a reaction tube made of quartz via an opening of the reaction tube;
a first seal made of resin that covers at least a first gap between the opening of the reaction tube and the gas supply nozzle;
a retainer made of metal, installed radially more outward than an outer peripheral surface of the reaction tube and connected to the gas supply nozzle so as to provide a gap between the gas supply nozzle and the retainer;
a cushioning structure made of non-metal material and provided between the retainer and the reaction tube;
a ring adapter installed radially more outward than the outer peripheral surface of the reaction tube and connected to the retainer;
a first fixing structure configured to hold the retainer and the ring adapter;
a second seal that covers at least a second gap between the gas supply nozzle and the ring adapter and maintains a space between the gas supply nozzle and the ring adapter in an airtight state; and
a third fixing structure configured to fix the first fixing structure in a predetermined posture,
wherein, in a state where the third fixing structure is fixed to the reaction tube, the gas supply nozzle protruding outward from the opening of the reaction tube is connected with the first seal, the retainer, the second seal, the first fixing structure and the ring adapter arranged in afore listed order; wherein an upper end of the first fixing structure is provided with a push bolt and a pull bolt, and an angle or orientation of the first fixing structure is adjustable by adjusting the push bolt and the pull bolt.

2. The gas supply structure of claim 1, wherein the gas supply nozzle and the reaction tube are connected with each other via the first seal so as to maintain the opening in an airtight state.

3. The gas supply structure of claim 1, wherein the second seal is made of resin.

4. The gas supply structure of claim 3, wherein the cushioning structure is made of fluororesin.

5. The gas supply structure of claim 1, further comprising a second fixing structure configured to press the ring adapter toward the reaction tube so as to close the opening.

6. The gas supply structure of claim 1, wherein the first seal is configured to prevent the gas supply nozzle from contacting the reaction tube.

7. The gas supply structure of claim 1, wherein the second seal is configured to prevent the gas supply nozzle from contacting the retainer.

8. The gas supply structure of claim 1, wherein the second seal is configured to be capable of covering the gap between the gas supply nozzle and the retainer.

9. The gas supply structure of claim 1, wherein the first fixing structure is configured such that the opening, the retainer and the ring adapter are arranged concentrically.

10. The gas supply structure of claim 1, wherein an upstream end of the gas supply nozzle is arranged so as to protrude to an outside of the reaction tube through the opening.

11. The gas supply structure of claim 1, wherein an upstream end of the gas supply nozzle is arranged so as to be connected to the gas supply nozzle in an airtight state through the ring adapter.

12. The gas supply structure of claim 1, further comprising a heater provided between the third fixing structure and the reaction tube, wherein the heater is configured to be capable of heating at least one among the gas supply nozzle, the reaction tube and the ring adapter.

13. The gas supply structure of claim 1, wherein a lower end of the first fixing structure is fixed to the third fixing structure by a fastening bolt.

14. A substrate processing apparatus comprising:
a reaction tube made of quartz in which a process chamber is provided, wherein a substrate is processed in the process chamber; and
a gas supply structure comprising:
a gas supply nozzle through which a process gas is supplied into the process chamber via an opening of the reaction tube made of quartz;
a first seal made of resin that covers at least a gap between the opening of the reaction tube and the gas supply nozzle;
a retainer made of metal, installed radially more outward than an outer peripheral surface of the reaction tube and connected to the gas supply nozzle so as to provide a first gap between the gas supply nozzle and the retainer;
a cushioning structure made of non-metal material and provided between the retainer and the reaction tube;
a ring adapter installed radially more outward than an outer peripheral surface of the reaction tube and connected to the retainer;
a first fixing structure configured to hold the retainer and the ring adapter;
a second seal that covers at least a second gap between the gas supply nozzle and the ring adapter and maintains a space between the gas supply nozzle and the ring adapter in an airtight state; and
a third fixing structure configured to fix the first fixing structure in a predetermined posture,
wherein, in a state where the third fixing structure is fixed to the reaction tube, the gas supply nozzle protruding outward from the opening of the reaction tube is connected with the first seal, the retainer, the second seal, the first fixing structure and the ring adapter arranged in aforelisted order; wherein an upper end of the first fixing structure is provided with a push bolt and a pull bolt, and an angle or orientation of the first fixing structure is adjustable by adjusting the push bolt and the pull bolt.

* * * * *